United States Patent [19]
MacKenzie

[11] Patent Number: 5,166,632
[45] Date of Patent: Nov. 24, 1992

[54] LIMITER CIRCUIT WITH MEANS TO ELIMINATE OFFSET AND AN OPTIONAL SELECTIVE THRESHOLD

[75] Inventor: Raymond W. MacKenzie, Baldwin Borough, Pa.

[73] Assignee: Westinghouse Electric Corp., Pittsburgh, Pa.

[21] Appl. No.: 774,481

[22] Filed: Oct. 10, 1991

[51] Int. Cl.$^5$ .................. H03K 5/00; H03K 5/08; H03K 5/153

[52] U.S. Cl. .................. 328/169; 307/261; 307/359; 307/555; 307/546

[58] Field of Search .......... 307/359, 362, 546, 553, 307/562, 264, 268, 261, 555; 328/13, 169, 1, 5

[56] References Cited

U.S. PATENT DOCUMENTS

| | | | |
|---|---|---|---|
| 3,916,342 | 10/1975 | Higuchi et al. | 307/268 |
| 3,917,993 | 11/1975 | Picmaus et al. | 307/268 |
| 4,233,563 | 11/1980 | Schanbacher | 307/268 |
| 4,564,821 | 1/1986 | Reichart | 307/362 |
| 4,634,983 | 1/1987 | Schemmel et al. | 307/261 |

Primary Examiner—Janice A. Howell
Assistant Examiner—Toan Tran
Attorney, Agent, or Firm—M. J. Moran

[57] ABSTRACT

A limiter circuit utilizes an RC circuit to provide negative feedback of the average value of the output signal of an amplifier, which may be an op-amp or a comparator, to the inverting input of the amplifier. The midpoint of the amplifier supply voltage is applied to the non-inverting input so that the amplifier operates in the linear range. This, combined with the elimination of the effects of offset produced by the negative feedback, results in a limiter circuit with increased sensitivity to small input signals and therefore extended dynamic range. Where a following circuit would be adversely affected by noise, hysteresis provided by positive feedback applied to the non-inverting input of the amplifier causes the limiter circuit to oscillate, at a frequency determined by the magnitude of the positive feedback and the time constant of the RC circuit providing the negative feedback, for input signals having an amplitude below a threshold set by the magnitude of the positive feedback.

12 Claims, 1 Drawing Sheet

LIMITER CIRCUIT WITH MEANS TO ELIMINATE OFFSET AND AN OPTIONAL SELECTIVE THRESHOLD

BACKGROUND OF THE INVENTION

1. Field of the Invention

This invention relates to limiter circuits implemented with op-amps or comparators. More particularly, it relates to such limiter circuits having negative feedback which eliminates the effects of offset and optional positive feedback which establishes a selectable threshold.

2. Background Information

Limiter circuits generate sharp rectangular waves with a fixed amplitude from a periodic signal such as a sine wave. They can also be used to sharpen the edges of square wave signals. A typical application for a limiter circuit is at the head of the frequency detection means in an FM or frequency shift keying (FSK) system to eliminate any amplitude sensitivity. A limiter circuit may be used, for example, in a data receiver to convert a variable amplitude sine wave input to a constant amplitude square wave. Conventionally, limiter circuits have utilized clipping diodes or an overdriven amplifier, and more particularly an op-amp. Such circuits are passive. Often a comparator is used as the amplifier. The comparator has a higher internal gain than a typical op-amp, and is intended to be operated rail to rail, while the op-amp typically operates in the linear region.

The op-amps and comparators typically used in limiters have a dc offset. This offset places a lower limit on the signal amplitude which may be processed. Further, when the signal amplitude is just slightly larger than the offset voltage, even harmonics will be present in the limiter output, which may degrade the operation of the subsequent frequency detection means. Thus, the offset limits the dynamic range of the limiter circuit. Higher quality op-amps have lower offset and therefore less error. However, use of a high quality op-amp significantly increases the cost of a limiter circuit and does not completely eliminate the offset. Comparators with very low offset are not available.

There is a need, therefore, for an improved limiter circuit which provides an increased dynamic range at a reasonable cost.

There are some applications in which the circuit receiving the output from the limiter can only accept an input signal at either of two levels, or where noise appearing at the limiter circuit output would present a problem.

Therefore, there is also a need for some applications for an improved limiter circuit which has a selectable threshold level.

SUMMARY OF THE INVENTION

In view of these needs, the objects of the invention include providing an improved limiter circuit with increased dynamic range.

It is a further object of the invention to provide such an improved limiter circuit which eliminates the effects of offset.

It is a further object of the invention to provide an improved limiter circuit with a selectable threshold level.

It is still another object of the invention to provide such an improved limiter circuit with a selectable threshold which has little harmonic distortion for signals just above the threshold.

These and other objects are realized by the invention which is a directed to a limiter circuit comprising amplifier means having an inverting input, a non-inverting input and an output generating a limiter output signal. The limiter circuit further includes means providing a supply voltage to the amplifier means and applying a midpoint of the supply voltage to the non-inverting input of the amplifier means. A negative feedback circuit generates an average value of the limiter output signal and applies it to the inverting input of the amplifier means. An input circuit applies the periodic input signal to be limited to one of the inputs of the amplifier means.

In accordance with the invention, the amplifier means can be either an inexpensive op-amp or a comparator, since the negative feedback circuit eliminates the effects of the dc offset which has conventionally been a problem with these devices when used in a limiter circuit.

As another aspect of the invention, positive feedback can be provided from the output of the amplifier means to the non-inverting input. The positive feedback provides hysteresis which ensures that the output level of the limiter circuit is binary valued. The combination of positive and negative feedback cause the output signal to oscillate when the amplitude of the input signal is below the amplitude of the positive feedback applied to the non-inverting input of the amplifier means. The positive and negative feedback are selected to cause the limiter circuit output to oscillate at a frequency well below the bandwidth of the periodic input signal so that the oscillation frequency will be rejected by a subsequent frequency detection means, and the oscillation will therefore provide a noise squelch function. The magnitude of the positive feedback also establishes the threshold for the limiter circuit.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
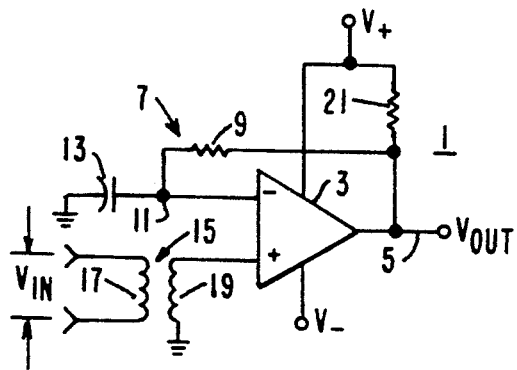
FIG. 1 is a schematic circuit diagram of a limiter circuit in accordance with the invention.

FIG. 1 illustrates a basic embodiment of the invention. The limiter circuit 1 of FIG. 1 includes an amplifier 3. The amplifier 3 can be either an op-amp or a comparator as the adverse effect of the offset is eliminated by the invention and is not a factor in selection of this component. For purposes of brevity, the term amplifier will be used throughout, but it is to be understood that this term as so used encompasses both an operational amplifier and a comparator.

The amplifier 3 is energized by voltages $V_+$ and $V_-$ of equal magnitude. Negative feedback from the output 5 of the amplifier 3 to the inverting input is provided by a series RC circuit 7 comprising a resistor 9 connected between the output 5 and a node 11, and a capacitor 13 connected between the node 11 and ground. The node 11 is also connected to the inverting input of the amplifier 3. An input transformer 15 has a primary winding 17 across which the periodic input signal $V_{in}$ is impressed and a secondary winding 19 connected between the non-inverting input of amplifier 3 and ground. A pull-up resistor 21 is connected between the $V_+$ supply and the output 5 of the amplifier 3.

The negative feedback circuit 7 is an integrator which drives the voltage on the inverting input of amplifier 3 to the average value of the output signal, $V_{out}$, appearing at the output 5. As the non-inverting input is connected to ground which is at the midpoint between $V_+$ and $V_-$, the amplifier 3 is biased in the linear range. As a result, the limiter circuit 1 will respond to very small signals, even signals smaller than the offset voltage of the amplifier because the negative feedback circuit 7 removes the effects of offset. Thus, the limiter circuit 1 has an extended dynamic range as compared to a conventional limiter circuit utilizing a comparable amplifier.

The limiter circuit 1 will convert a periodic input signal $V_{in}$ applied to the primary winding 17 of the transformer 15 to a square wave output signal, $V_{out}$, of the same frequency and constant amplitude.

Figure 2:
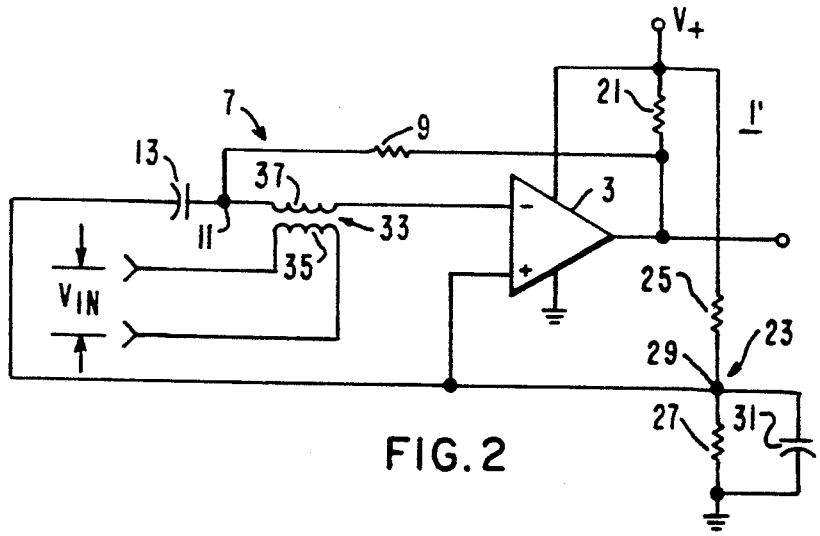
FIG. 2 is a schematic circuit diagram of another embodiment of a limiter circuit in accordance with the invention.

FIG. 2 illustrates another embodiment 1' of a limiter circuit in accordance with the invention, and in which like components are identified with like reference characters. This circuit 1' differs from the limiter circuit 1 of FIG. 1 in two respects. First, the supply voltages applied to the amplifier 3 are $V_+$ and ground. The non-inverting input of the amplifier 3 and the capacitor 13 of the negative feedback circuit 7 are biased to the midpoint of the supply voltages by a voltage divider 23 composed of the resistors 25 and 27 connected in series between the $V_+$ and ground supply voltages. The resistors 25 and 27 are of equal value so that the node 29 between the resistors is at the midpoint of the supply voltages A capacitor 31 between the node 29 and ground serves as an ac ground.

The second difference between the circuit 1' of FIG. 2 and the circuit 1 of FIG. 1 is that the periodic input signal $V_{in}$ is applied to the inverting input, rather than the non-inverting input. To this end, a transformer 33 has a primary winding 35 to which the periodic input signal $V_{in}$ is a applied, and a secondary winding 37 connected between the node 11 and the non-inverting input of the amplifier 3. The limiter circuit 1' performs substantially similarly to the circuit 1 of FIG. 1 except that the sense of the output signal $V_{out}$ to the input $V_{in}$ is reversed. In addition, the output signal $V_{out}$ will not be bipolar, but will alternate between a zero level and $V_+$.

The input transformers 15 and 33 of the circuits 1 and 1', respectively, provide isolation between a circuit (not shown) generating the periodic input signal, $V_{in}$, and the limiter circuits 1, 1'. The turns ratios of these transformers are determined by factors independent of the limiter circuits as any turns ratio could be used as far as the operation of the limiter circuits is concerned.

Figure 3:
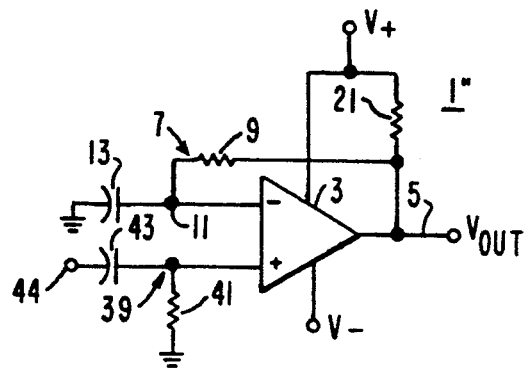
FIG. 3 is a schematic circuit diagram of yet another embodiment of a limiter circuit in accordance with the invention.

FIG. 3 shows another embodiment 1" of a limiter circuit in accordance with the invention. Again, like components are identified by like reference characters. This limiter circuit 1" differs from the limiter circuit 1 of FIG. 1 in that it has an RC input circuit 39 in place of the input transformer 15. The RC circuit 39 includes a resistor 41 connected between the non-inverting input and ground, and a capacitor 43 through which the periodic input signal, applied to an input terminal 44, is connected to the non-inverting input of the amplifier 3. This configuration of the limiter circuit is suitable for use with single ended periodic input signals.

As the input signals in the circuits 1, 1' and 1" of FIGS. 1, 2 and 3, respectively, are referenced to the midpoint of the supply voltages, if the amplifier 3 has identical and/or small positive and negative saturation voltages, the feedback provided by the negative feedback circuit 7 will cause the output duty cycle of the output signal $V_{out}$ to be exactly 50% when a signal is present. In the absence of a signal applied to the circuits 1, 1' and 1", the output will be at the midpoint of the supply voltages, and any noise present at the input will appear at the output. This will present no problem in some applications, as when the frequency detection means is a tuned discriminator used in conjunction with a suitable loss-of-signal detection circuit to squelch the noise.

Figure 4:
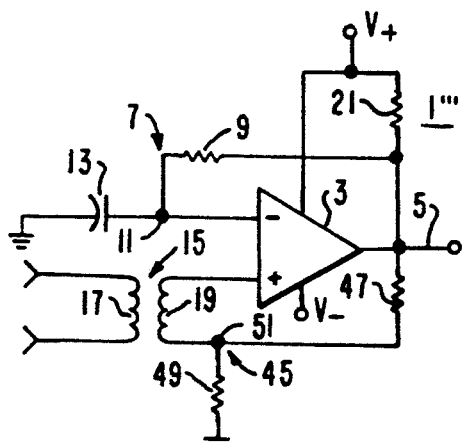
FIG. 4 is a schematic circuit diagram of still another embodiment of a limiter circuit in accordance with the invention.

However, when a subsequent digital circuit input must be only at either of two levels, or when noise appearing at the limiter circuit output would present a problem, the embodiment of the limiter circuit 1''' shown in FIG. 4 can be used. Again, in this circuit 1''', components common with the components of the circuit 1 of FIG. 1 are identified by like reference characters. This circuit 1''' differs from the circuit 1 of FIG. 1 in that it uses the negative feedback along with positive feedback (hysteresis) to preclude linear operation. Negative feedback is provided by the negative feedback circuit 7 which is identical to the negative feedback circuit of FIG. 1. Positive feedback is provided in the circuit 1''' by the voltage divider 45 comprising the resistors 47 and 49 connected in series between the output 5 of the amplifier 3 and ground. The junction 51 between the resistors 47 and 49 is connected through the secondary 19 of the transformer 15 to the non-inverting input of the amplifier 3.

In the absence of a signal, the circuit 1''' will oscillate at a frequency determined by the hysteresis amplitude and the time constant of the negative feedback circuit 7. Thus, the oscillation frequency can be placed anywhere below the frequency of the periodic input signal. The minimum usable signal is determined solely by the hysteresis amplitude, and assuming the oscillation frequency is low enough to be rejected by the subsequent frequency detection means, the oscillation effectively squelches noise. The sensitivity to the periodic input signal is determined by the positive feedback The magnitude of the periodic input signal must be greater than the positive feedback voltage in order to generate the square wave output voltage. Thus, the circuit 1''' has a controlled threshold which is set by the magnitude of the positive feedback signal. The non-inverting input of the amplifier 3 is still biased to the midpoint of the supply voltages The value of the resistor 47 is much much greater than the value of the resistor 49 because several volts output is desired and only a few millivolts positive feedback is needed. The oscillation frequency of the circuit 1''' is set below the frequency of the periodic input signal so that oscillation is never completed when the input signal is present. The function of the following circuit connected to the output 5 of the limiter circuit 1''' determines how much the oscillating frequency must be set below the frequency of the periodic input signal. The oscillating frequency is determined by the amplitude of the positive feedback signal and the time constant of the negative feedback. In setting this oscillating frequency, the hysteresis is selected by setting the peak to peak of the positive feedback voltage to the desired threshold value. The RC time constant of the negative feedback circuit 7 is then adjusted to produce the threshold voltage in one half cycle of the desired frequency of oscillation.

Figure 5:
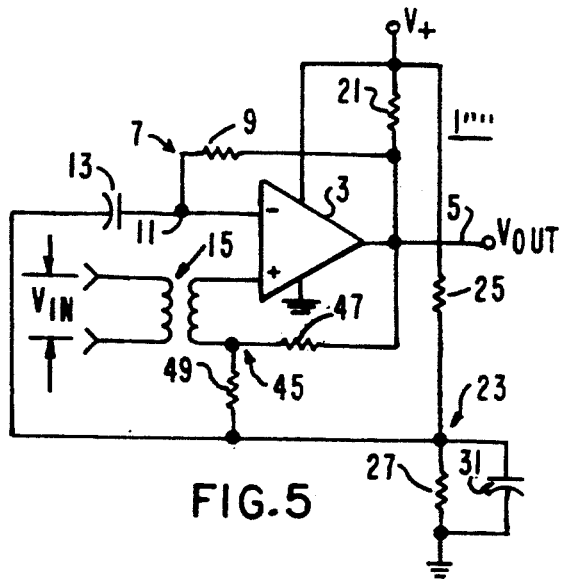
FIG. 5 is a schematic circuit diagram of an additional embodiment of a limiter circuit in accordance with the invention.

FIG. 5 illustrates a limiter circuit 1'''' which is the circuit 1''' modified for single polarity supply voltages for the amplifier 3 and with the non-inverting input and the capacitor of the negative feedback circuit biased to the midpoint of the supply voltage, or $V_+/2$ by the voltage divider 23.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed is:

1. A limiter circuit comprising:
    amplifier means having an inverting input, a non-inverting input, and an output generating a limiter output signal;
    means applying a supply voltage to said amplifier means;
    means applying a midpoint of said supply voltage to said non-inverting input of said amplifier means;
    negative feedback means comprising a resistor connected to said output of said amplifier means, a capacitor connected in series between said resistor and said means applying said midpoint of said supply voltage, and means connected from a node between said resistor and capacitor to said inverting input of said amplifier means; and
    means applying a periodic input signal to one of said inputs of said amplifier means.

2. A limiter circuit comprising:
    amplifier means having an inverting input, a non-inverting input, and an output generating a limiter output signal;
    means applying a supply voltage to said amplifier means;
    means applying a midpoint of said supply voltage to said non-inverting input of said amplifier means;
    means applying a periodic input signal having a predetermined bandwidth to one of said inputs of said amplifier means;
    negative feedback means comprising a resistor connected to said output of said amplifier means, a capacitor connected in series between said resistor and said means applying said midpoint of said supply voltage, and means connected from a node between said resistor and capacitor to said inverting input; and
    positive feedback means comprising first and second resistors connected between said output of said amplifier means and said means applying said midpoint of said supply voltage to the non-inverting input of said amplifier means, and means connected between said first and second resistors and to said non-inverting input of said amplifier means.

3. A limiter circuit comprising:
    amplifier means having an inverting input, a non-inverting input, and an output generating a limiter output signal;
    means applying a supply voltage to said amplifier means;
    means applying a midpoint of said supply voltage to said non-inverting input of said amplifier means;
    negative feedback means receiving said limiter output signal for generating an average value of said limiter output signal and applying said average value to said inverting input of said amplifier means; and
    means applying a periodic input signal to one of said inputs of said amplifier means,
    wherein said means applying said periodic input signal is a transformer with a primary winding to which said input signal is applied and a secondary winding connected to said one input of said amplifier means.

4. A limiter circuit comprising:
    amplifier means having an inverting input, a non-inverting input, and an output generating a limiter output signal;
    means applying a supply voltage to said amplifier means;
    means applying a midpoint of said supply voltage to the non-inverting input of said amplifier means;
    negative feedback means receiving said limiter output signal for generating an average value of said limiter output signal and applying said average value to said inverting input of said amplifier means; and
    means applying a periodic input signal to one of said inputs of said amplifier means,
    wherein said means applying said periodic input signal comprises an input terminal to which said periodic input signal is applied, a capacitor connected between said input terminal and said non-inverting input of said amplifier means, and a resistor connected between said non-inverting input and said means applying the midpoint of said supply voltage to said non-inverting input.

5. A limiter circuit comprising:
    amplifier means having an inverting input, a non-inverting input, and an output generating a limiter output signal;
    means applying a supply voltage to said amplifier means;
    means applying a midpoint of said supply voltage to the non-inverting input of said amplifier means;
    negative feedback means receiving said limiter output signal for generating an average value of said limiter output signal and applying said average value to said inverting input of said amplifier means; and
    means applying a periodic input signal to one of said inputs of said amplifier means,
    wherein said periodic input signal has a predetermined frequency and wherein said negative feedback means comprises a series RC circuit having an oscillation frequency below said predetermined frequency of said periodic input signal.

6. A limiter circuit comprising:
    amplifier means having an inverting input, a non-inverting input, and an output generating a limiter output signal;

means applying a supply voltage to said amplifier means;

means applying a midpoint of said supply voltage to the non-inverting input of said amplifier means;

negative feedback means receiving said limiter output signal for generating an average value of said limiter output signal and applying said average value to said inverting input of said amplifier means; and means applying a periodic input signal to one of said inputs of said amplifier means, wherein said periodic input signal has a predetermined frequency and said limiter circuit further comprises positive feedback means supplying positive feedback from said output of said amplifier means to said non-inverting input, said negative feedback means and positive feedback means being selected to cause the output signal to oscillate at a frequency below said predetermined bandwidth frequency of the periodic input signal when the periodic input signal has an amplitude below a preset threshold amplitude.

7. The limiter circuit of claim 3 wherein said one input of said amplifier means is said non-inverting input.

8. The limiter circuit of claim 3 wherein said one input of said amplifier means is said inverting input.

9. The limiter circuit of claim 5 wherein aid series RC circuit comprises a resistor connected to said output of said amplifier means, a capacitor connected in series between said resistor and said means applying the midpoint of said supply voltage, and means connected from a node between said resistor and capacitor to said inverting input.

10. The limiter circuit of claim 6 wherein said positive feedback means comprises means applying a positive feedback signal to said non-inverting input of said amplifier means having an amplitude which sets said preset threshold.

11. The limiter circuit of claim 6 wherein said positive feedback means comprises a voltage divider connected between said output and said means applying the midpoint of said supply voltage and includes first and second series connected resistors and means connected from a node between said resistors to said non-inverting input of said amplifier means.

12. The limiter circuit of claim 11 wherein said negative feedback means comprises a resistor connected to said output of said amplifier means, a capacitor connected in series between said resistor and said means applying the midpoint of said supply voltage, and means connected from a node between said resistor and capacitor said inverting input of said amplifier means.

* * * * *